(12) United States Patent
Zhang (10) Patent No.: US 10,395,927 B2
(45) Date of Patent: Aug. 27, 2019

(54) METHOD FOR MANUFACTURING SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Cheng Long Zhang, Shanghai (CN)

(73) Assignees: SEMICONDUCTOR MFG. INTL. (SHANGHAI) CORP., Shanghai (CN); SEMICONDUCTOR MFG. INTL. (BEIJING) CORP., Beijing (CN)

( * ) Notice: Subject to any disclaimer, the term of this patent is extended or adjusted under 35 U.S.C. 154(b) by 0 days.

(21) Appl. No.: 16/023,200

(22) Filed: Jun. 29, 2018

(65) Prior Publication Data

US 2019/0006179 A1 Jan. 3, 2019

(30) Foreign Application Priority Data

Jun. 29, 2017 (CN) .......................... 2017 1 0510897

(51) Int. Cl.
*H01L 21/311* (2006.01)
*H01L 21/033* (2006.01)

(52) U.S. Cl.
CPC ...... *H01L 21/0337* (2013.01); *H01L 21/0332* (2013.01); *H01L 21/31122* (2013.01); *H01L 21/31144* (2013.01)

(58) Field of Classification Search
CPC ........... H01L 21/0337; H01L 21/31144; H01L 21/31122; H01L 21/0332
See application file for complete search history.

(56) References Cited

U.S. PATENT DOCUMENTS

| 2014/0097520 | A1* | 4/2014 | Millward .......... H01L 21/76816 257/622 |
| 2015/0214094 | A1* | 7/2015 | Jezewski ............ H01L 21/7688 438/618 |
| 2016/0042950 | A1* | 2/2016 | Dai ..................... H01L 21/0337 438/703 |
| 2017/0092496 | A1* | 3/2017 | deVilliers ........... H01L 21/0337 |
| 2018/0138040 | A1* | 5/2018 | LaVoie ................. C23C 16/042 |

(Continued)

*Primary Examiner* — Ismail A Muse
(74) *Attorney, Agent, or Firm* — Brinks Gilson & Lione (57) ABSTRACT

The present application relates to the field of semiconductor technologies, and discloses methods for manufacturing a semiconductor device. The manufacturing method includes: forming an etchable material layer on a substrate; forming multiple openings on the etchable material layer by means of patterning processing to determine a position of a core; etching the substrate at bottoms of the multiple openings, so that the bottoms of the multiple openings extend into the substrate; depositing a material of the core to fill the multiple openings; etching the material of the core so as to expose the etchable material layer; removing the etchable material layer to leave multiple cores; depositing spacers; over etching the spacers so as to expose the multiple cores, and etching a part of the substrate, where an etching depth of the substrate is the same as a depth to which the openings extend into the substrate; and removing the multiple cores. The methods address the problem of a distance offset of gaps between spacers.

7 Claims, 6 Drawing Sheets

(56) References Cited

U.S. PATENT DOCUMENTS

| | | | |
|---|---|---|---|
| 2018/0204731 A1* | 7/2018 | Zhang | H01L 21/0337 |
| 2018/0277386 A1* | 9/2018 | Sherpa | H01L 21/768 |
| 2018/0286693 A1* | 10/2018 | Zhou | H01L 21/0337 |
| 2018/0358459 A1* | 12/2018 | Anderson | H01L 29/785 |
| 2019/0013245 A1* | 1/2019 | Jha | H01L 21/32139 |

* cited by examiner

METHOD FOR MANUFACTURING SEMICONDUCTOR DEVICE

RELATED APPLICATIONS

The present application claims priority to Chinese Patent Appln. No. 201710510897.6, filed Jun. 29, 2017, the entire disclosure of which is hereby incorporated by reference.

BACKGROUND

Technical Field

The present application relates to the field of semiconductor technologies, and in particular, to a method for manufacturing a semiconductor device.

Related Art

With the development of semiconductor technologies, requirements on process fineness of semiconductor device manufacturing has increased. For example, the size of a process node is already reduced to 14 nm or even less. A semiconductor device may be manufactured using a self-aligned double patterning process cooperating with an argon fluoride 193 nm photoetching process.

SUMMARY

The inventor of this application finds that the following problems exist in the foregoing prior art: when spacers are formed, openings between the spacers usually have an offset distance. That is, depths of the openings are different, causing an etching offset or the loss of an etching stopping layer during over etching.

An objective of the present application is to provide a technical solution of manufacturing a semiconductor device so as to address the problem of a distance offset of gaps between spacers.

In one aspect of the disclosure, a method for manufacturing a semiconductor device is provided. The method may include: forming an etchable material layer on a substrate; forming multiple openings on the etchable material layer by means of patterning processing to determine a position of a core; etching the substrate at bottoms of the multiple openings, so that the bottoms of the multiple openings extend into the substrate; depositing a material of the core to fill the multiple openings; etching the material of the core so as to expose the etchable material layer; removing the etchable material layer to leave multiple cores; depositing spacers; over etching the spacers so as to expose the multiple cores, and etching a part of the substrate, where an etching depth of the substrate is the same as a depth to which the openings extend into the substrate; and removing the multiple cores.

In some implementations, the etchable material layer includes an amorphous carbon layer and a low-temperature oxide layer.

In some implementations, the determining a position of a core includes: forming a bottom anti-reflection coating on the etchable material layer; photoetching the bottom anti-reflection coating to form a mask pattern needed by patterning; and etching the etchable material layer to form the multiple openings.

In some implementations, the etchable material layer is removed by means of back etching and ashing to leave the multiple cores.

In some implementations, the back etching is implemented by using a plasma etching method.

In some implementations, the material of the core is an oxide; and the oxide is deposited by using a flowable chemical vapor deposition (FCVD) method.

In some implementations, the spacers are an oxide; and the oxide is deposited by using an atomic layer deposition (ALD) method.

One advantage of this application is that over etching amounts of the substrate are controlled to be consistent when the position of the core is determined and the spacers are etched, so that the depth consistency of the openings between the spacers is ensured, thereby addressing the problem of a distance offset of the openings between the spacers.

BRIEF DESCRIPTION OF THE DRAWINGS

The accompanying drawings constitute a part of the specification describing embodiments and implementations of this application and are used for explaining the principles' of this application together with the specification.

With reference to the accompanying drawings, this application may be more clearly understood according to detailed descriptions below, where.

DETAILED DESCRIPTION

Exemplary embodiments and implementations of this application are described in detail with reference to the accompanying drawings. It should be noted that unless otherwise specifically described, relative arrangements, numerical expressions, and values of parts and steps stated in these embodiments and forms do not limit the scope of this application.

In addition, it should be understood that for ease of description, sizes of parts shown in the accompanying drawings are not drawn according to actual ratio relationships.

The following descriptions of at least one exemplary embodiment are merely illustrative and do not constitute any limitation to this application or application or use thereof.

Technologies, methods, and devices that are known to a person of ordinary skill in the art may not be discussed in detail, but in proper cases, the technologies, methods, and devices should be considered as a part of the authorized specification.

In all examples that are shown and discussed herein, any specific value should be explained to be merely exemplary and do not constitute a limitation. Therefore, other examples of exemplary embodiments may have different values.

It should be noted that similar marks and letters represent similar items in the following accompanying drawings. Therefore, once an item is defined in an accompany drawing, the item does not need to be further discussed in subsequent accompanying drawings.

Figure 1:
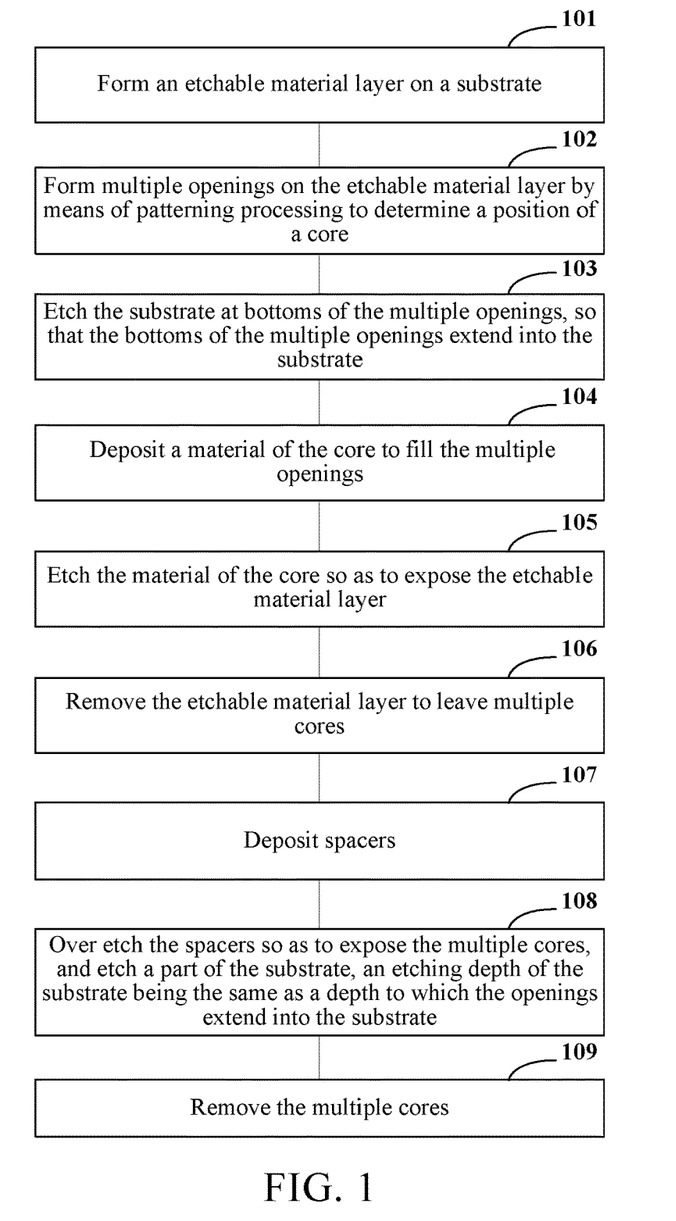
FIG. 1 is a flowchart of one form of a method for manufacturing a semiconductor device.

FIG. 1 is a flowchart of one form of a method for manufacturing a semiconductor device.

Figure 2A:
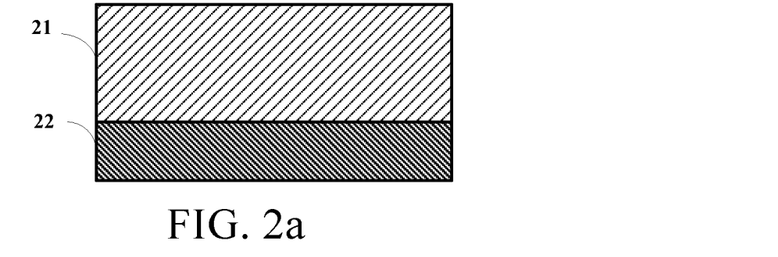
FIG. 2a to FIG. 2i are schematic diagrams of stages of a method for manufacturing a semiconductor device.

As shown in FIG. 1, step 101: Form an etchable material layer 21 on a substrate 22. This is shown in FIG. 2a. For example, the etchable material layer 21 may be an amorphous carbon layer, and the substrate may be made of titanium nitride.

Figure 2B:
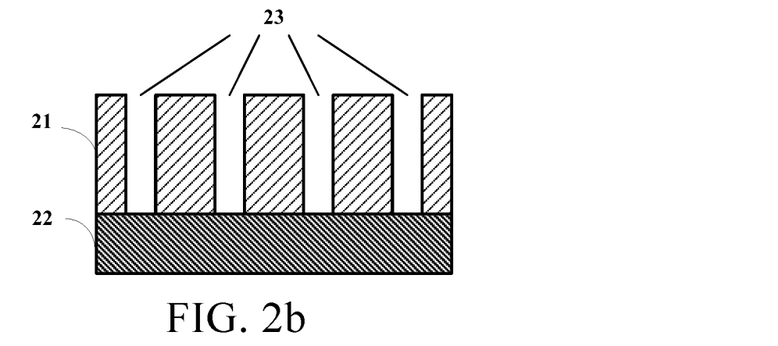

Step 102: Form multiple openings 23 on the etchable material layer 21 by means of patterning processing to determine a position of a core, as shown in FIG. 2b.

Figure 2C:
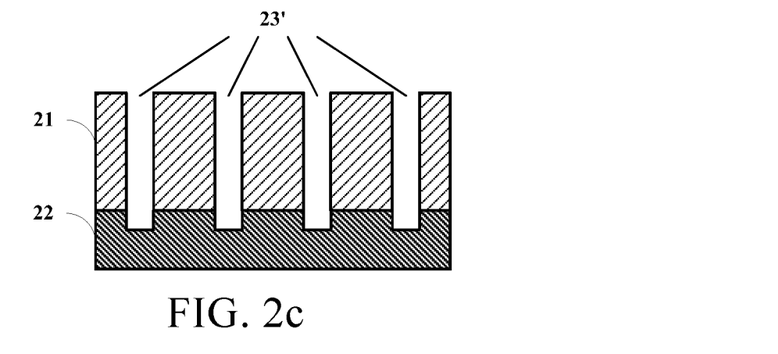

Step 103: Etch the substrate 22 at bottoms of the multiple openings 23, so that the bottoms of the multiple openings 23' extend into the substrate 22, as shown in FIG. 2c.

Figure 2D:
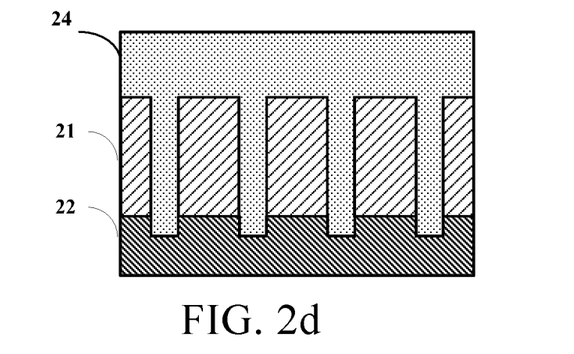

Step 104: Deposit a material 24 of the core to fill the multiple openings, as shown in FIG. 2d.

In some implementations, the material 24 of the core is deposited by using a FCVD method, and the material 24 of the core may be made of an oxide.

Figure 2E:
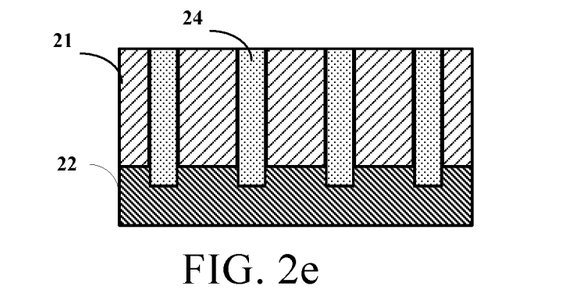

Step 105: Etch the material 24 of the core so as to expose the etchable material layer 21, as shown in FIG. 2e.

In some implementations, the material 24 of the core that is higher than the etchable material layer 21 is removed by means of oxide etching processing.

Figure 2F:
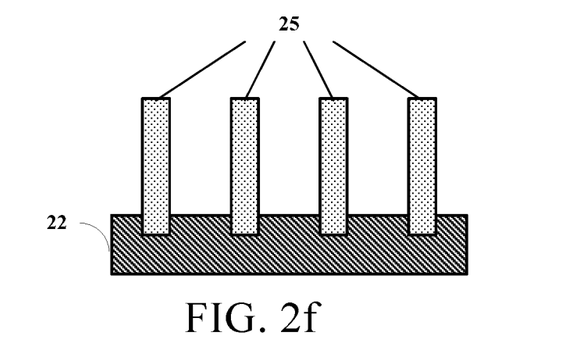

Step 106: Remove the etchable material layer 21 to leave multiple cores 25, as shown in FIG. 2f.

In some implementations, the etchable material layer 21 is removed by means of back etching and ashing, to leave the multiple cores 25.

Figure 2G:
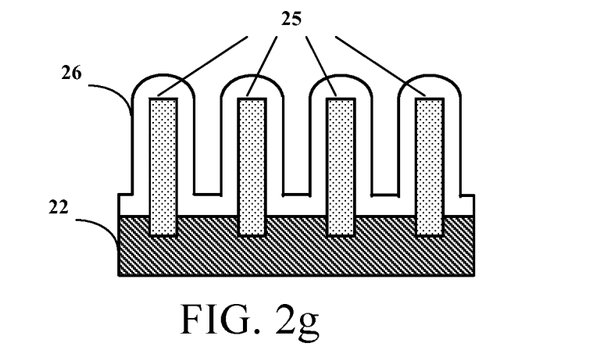

Step 107: Deposit spacers 26, as shown in FIG. 2g.

In some implementations, the spacers 26 are deposited by using an ALD method, and the spacers 26 may be an oxide.

Figure 2H:
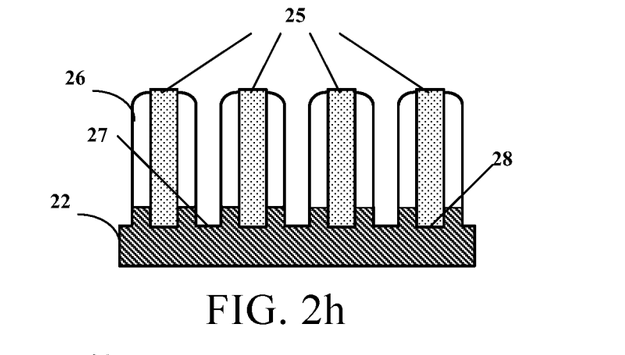

Step 108: Over etch the spacers 26 so as to expose the multiple cores 25, and etch a part of the substrate 22, an etching depth 27 of the substrate 22 being the same as a depth 28 to which the openings extend into the substrate, as shown in FIG. 2h.

In some implementations, the spacers 26 are etched using a plasma etching method.

Figure 2I:
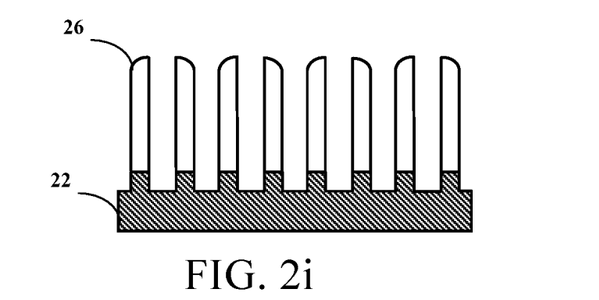

Step 109: Remove the multiple cores 25. An obtained semiconductor device is shown in FIG. 2i.

In the foregoing description, an over etching amount of the spacers is set based on the etching depth of the substrate, so as to ensure the depth consistency of the openings between the spacers, thereby avoiding an etching offset or the loss of an etching stopping layer during the over etching due to an distance offset of the openings between the spacers.

Figure 3:
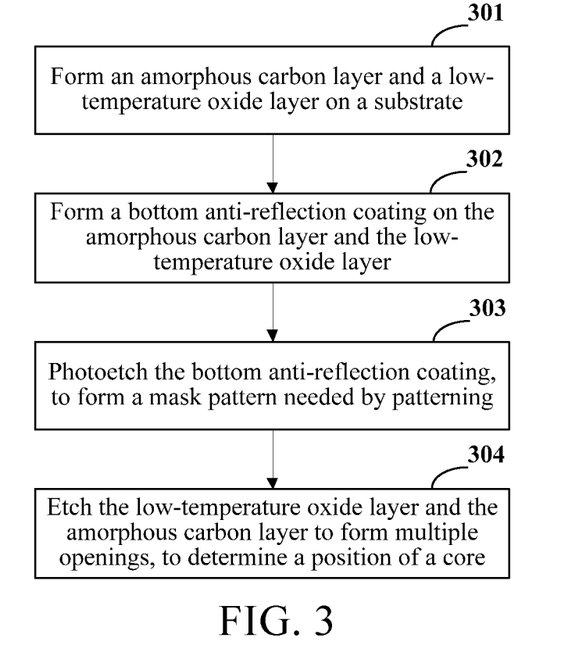
FIG. 3 is a flowchart of one form of a method for determining a position of a core.

FIG. 3 is a flowchart of one form of a method for determining a position of a core according to this application.

Figure 4A:
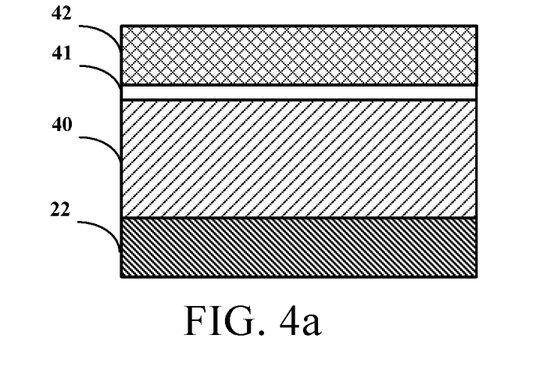
FIG. 4a to FIG. 4c are schematic diagrams of stages of a method for determining a position of a core.

As shown in FIG. 3, step 301: Form an amorphous carbon layer 40 and a low-temperature oxide layer 41 on the substrate 22, as shown in FIG. 4a.

Step 302: Form a bottom anti-reflection coating 42 on the amorphous carbon layer 40 and the low-temperature oxide layer 41, as shown in FIG. 4a.

Figure 4B:
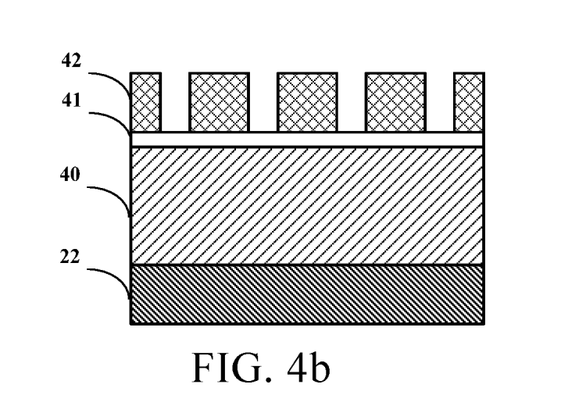

Step 303: Photoetch the bottom anti-reflection coating 42, to form a mask pattern needed by patterning, as shown in FIG. 4b.

Figure 4C:
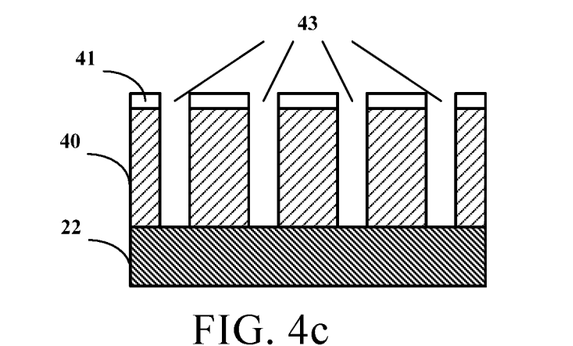

Step 304: Etch the low-temperature oxide layer 41 and the amorphous carbon layer 40 to form the multiple openings 43, to determine the position of the core, as shown in FIG. 4c. Then, the low-temperature oxide layer 41 and the amorphous carbon layer 40 are etched, so that the bottoms of the openings 43 extend into the substrate 22, and the low-temperature oxide layer 41 is consumed.

In the foregoing description, the openings are formed by etching the substrate, the position of the core is determined, and the depths of the openings provide a basis for an etching amount of the substrate during the subsequent over etching on the spacers, so as to ensure the depth consistency of the openings between the spacers, thereby avoiding an etching offset or the loss of an etching stopping layer during the over etching due to an distance offset of the openings between the spacers.

Above, methods for manufacturing a semiconductor device are described in detail. In describing the methods, some details well known in the art are not described. A person skilled in the art will understand, according to the foregoing descriptions, how to implement the technical solutions disclosed herein.

The methods and systems of this application may be implemented in multiple manners. For example, the methods and systems of this application may be implemented using software, hardware, firmware, or any combination of software, hardware, and firmware. The sequence of the steps of the methods is merely used for description. The steps of the methods of this application are not limited to the foregoing specifically described sequence unless especially described in another manner. In addition, in some embodiments and forms, this application may also be implemented as programs recorded in a recording medium. These programs include machine readable instructions for performing the method of this application. Therefore, the recording medium storing the programs used for performing the method of this application is further covered in this application.

Although some specific embodiments and forms of this application are described in detail using examples, a person skilled in the art will understand that the foregoing examples are merely used for description and are not intended to limit the scope of this application. A person skilled in the art should understand that the foregoing embodiments and forms may be amended without departing from the scope and spirit of this application. The scope of this application is defined by the appended claims.

What is claimed is:

1. A method for manufacturing a semiconductor device, comprising:
    forming an etchable material layer on a substrate;
    forming multiple openings on the etchable material layer by means of a patterning processing to determine a position of a core;
    etching the substrate at bottoms of the multiple openings so that the bottoms of the multiple openings extend into the substrate;
    depositing a material of a core to fill the multiple openings;
    etching the material of the core to expose the etchable material layer;
    removing the etchable material layer to leave multiple cores;
    depositing spacers;
    over etching the spacers to expose the multiple cores, and etching a part of the substrate, wherein an etching depth of the etched part of the substrate is the same as a depth to which the openings extend into the substrate; and
    removing the multiple cores.

2. The manufacturing method according to claim 1, wherein
    the etchable material layer comprises an amorphous carbon layer and a low-temperature oxide layer.

3. The manufacturing method according to claim 1, wherein determining the position of the core comprises:
    forming a bottom anti-reflection coating on the etchable material layer;

photoetching the bottom anti-reflection coating by patterning to form a mask pattern; and etching the etchable material layer to form the multiple openings.

4. The manufacturing method according to claim 1, wherein:

the etchable material layer is removed by means of back etching and ashing to leave the multiple cores.

5. The manufacturing method according to claim 4, wherein the back etching is implemented using a plasma etching method.

6. The manufacturing method according to claim 1, wherein:

the material of the core is an oxide; and the oxide is deposited using a flowable chemical vapor deposition (FCVD) method.

7. The manufacturing method according to claim 1, wherein:

the spacers are an oxide; and the oxide is deposited using an atomic layer deposition (ALD) method.

\* \* \* \* \*